(12) United States Patent
Chen et al.

(10) Patent No.: US 7,096,819 B2
(45) Date of Patent: Aug. 29, 2006

(54) INDUCTIVE PLASMA PROCESSOR HAVING COIL WITH PLURAL WINDINGS AND METHOD OF CONTROLLING PLASMA DENSITY

(75) Inventors: Jian J. Chen, Fremont, CA (US); Robert G. Veltrop, Eagle, ID (US); Thomas E. Wicker, Reno, NV (US)

(73) Assignee: Lam Research Corporation, Fremont, CA (US)

( * ) Notice: Subject to any disclaimer, the term of this patent is extended or adjusted under 35 U.S.C. 154(b) by 788 days.

(21) Appl. No.: 09/821,027

(22) Filed: Mar. 30, 2001

(65) Prior Publication Data

US 2002/0185228 A1    Dec. 12, 2002

(51) Int. Cl.
*C23C 16/00* (2006.01)
*H01L 21/00* (2006.01)

(52) U.S. Cl. ............................ 118/723 I; 156/345.48
(58) Field of Classification Search ........... 156/345.48, 156/345.49; 118/723 I, 723 AN, 723 IR; 315/111.51
See application file for complete search history.

(56) References Cited

U.S. PATENT DOCUMENTS

| | | | |
|---|---|---|---|
| 4,948,458 A | 8/1990 | Ogle | |
| 5,226,967 A | 7/1993 | Chen et al. | |
| 5,277,752 A | 1/1994 | Aydil et al. | |
| 5,304,279 A | 4/1994 | Coultas et al. | |
| 5,368,710 A | 11/1994 | Chen et al. | |
| 5,401,350 A | 3/1995 | Patrick et al. | |
| 5,558,722 A | 9/1996 | Okumura et al. | |
| 5,571,366 A * | 11/1996 | Ishii et al. ............. | 156/345.26 |
| 5,589,737 A | 12/1996 | Barnes et al. | |
| 5,688,357 A * | 11/1997 | Hanawa ................. | 156/345.28 |
| 5,731,565 A | 3/1998 | Gates | |
| 5,759,280 A | 6/1998 | Holland et al. | |
| 5,795,429 A | 8/1998 | Ishii et al. | |

(Continued)

FOREIGN PATENT DOCUMENTS

EP           0838843 A2      4/1998

(Continued)

*Primary Examiner*—Parviz Hassanzadeh
*Assistant Examiner*—Michelle Crowell

(57) ABSTRACT

An inductive plasma processor includes a multiple winding radio frequency coil having plural electrically parallel, spatially concentric windings (1) having different amounts of RF power supplied to them, and (2) arranged to produce electromagnetic fields having different couplings to different regions of plasma in the chamber to control plasma flux distribution incident on a processed workpiece. The coil is powered by a single radio frequency generator via a single matching network. Input and output ends of each winding are respectively connected to input and output tuning capacitors. In a first embodiment, the location of maximum inductive coupling of the radio frequency to the plasma and the current magnitude in each winding are respectively mainly determined by values of the output and input capacitors. By adjusting all the input and output capacitors simultaneously, the current to a winding can be varied while the current to the other winding can be maintained constant as if these windings were completely de-coupled and independent. Therefore, the capacitors can control the plasma density in different radial and azimuthal regions. In another embodiment, a relatively low frequency drives the coil whereby each winding has a relatively short electrical length, causing substantially small standing wave current and voltage variations. The output capacitor for each winding adjusts current magnitude, to eliminate the need for the input capacitors and reduce operational complexity.

26 Claims, 4 Drawing Sheets

U.S. PATENT DOCUMENTS

| | | |
|---|---|---|
| 5,800,619 A | 9/1998 | Holland et al. |
| 5,865,937 A * | 2/1999 | Shan et al. ............. 156/345.44 |
| 5,874,704 A | 2/1999 | Gates |
| 5,897,713 A * | 4/1999 | Tomioka et al. .......... 118/723 I |
| 5,907,221 A * | 5/1999 | Sato et al. .............. 315/111.51 |
| 5,935,373 A * | 8/1999 | Koshimizu ............... 118/723 I |
| 6,028,395 A | 2/2000 | Holland et al. |
| 6,051,073 A * | 4/2000 | Chu et al. .................. 438/766 |
| 6,080,271 A * | 6/2000 | Fujii ..................... 156/345.48 |
| 6,095,159 A * | 8/2000 | Blalock et al. ............. 134/1.1 |
| 6,136,139 A | 10/2000 | Ishii et al. |
| 6,164,241 A | 12/2000 | Chen et al. |
| 6,165,311 A | 12/2000 | Collins et al. |
| 6,174,450 B1 * | 1/2001 | Patrick et al. ................ 216/61 |
| 6,238,512 B1 * | 5/2001 | Li et al. ................. 156/345.43 |
| 6,252,354 B1 * | 6/2001 | Collins et al. .......... 315/111.51 |
| 6,288,493 B1 * | 9/2001 | Lee et al. ............... 315/111.51 |
| 6,319,355 B1 * | 11/2001 | Holland .................. 156/345.48 |
| 6,414,648 B1 * | 7/2002 | Holland et al. ............. 343/895 |
| 6,579,426 B1 * | 6/2003 | van Gogh et al. ...... 204/192.25 |

FOREIGN PATENT DOCUMENTS

| | | |
|---|---|---|
| EP | 1 130 948 A1 | 9/2001 |
| JP | 40805998 A * | 2/1996 |
| JP | 11144894 A * | 5/1999 |
| WO | WO 00/00993 | 1/2000 |
| WO | WO 01/19144 A1 | 3/2001 |

\* cited by examiner

INDUCTIVE PLASMA PROCESSOR HAVING COIL WITH PLURAL WINDINGS AND METHOD OF CONTROLLING PLASMA DENSITY

TECHNICAL FIELD

The present invention relates generally to inductive plasma workpiece processors including an RF plasma excitation coil and, more particularly, to such processors wherein the coil includes plural windings (1) having different amounts of RF power supplied to them, and (2) arranged to supply RF magnetic fields having different flux magnitudes to plasma in the chamber to control plasma flux distribution incident on a processed workpiece, and to a method of operating same. The invention also relates to an inductive plasma workpiece processor including a coil having plural parallel electrically short windings connected to impedance arrangements for controlling the amplitude of current flowing in the windings. The invention also relates to a method of making an inductive plasma processor wherein one winding of a coil is positioned relative to another winding of the coil for optimum workpiece processing.

BACKGROUND ART

An inductive plasma processor treats workpieces with an RF plasma in a vacuum chamber and includes a coil responsive to an RF source. The coil, which can be planar or spherical or dome shaped, is driven by the RF source to generate electromagnetic fields that excite ionizable gas in the chamber to produce a plasma. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it. The workpiece is typically a semiconductor wafer having a planar circular surface or a solid dielectric plate, e.g., a rectangular glass substrate used in flat panel displays, or a metal plate.

Ogle, U.S. Pat. No. 4,948,458 discloses a multi-turn spiral planar coil for achieving the above results. The spiral, which is generally of the Archimedes type, extends radially and circumferentially between its interior and exterior terminals connected to the RF source via an impedance matching network. Coils produce oscillating RF fields having magnetic and electric field components that penetrate through the dielectric window to excite electrons and ions in a portion of the plasma chamber close to the window. The spatial distribution of the magnetic field in the plasma portion close to the window is a function of the sum of individual magnetic field components produced by the current at each point of the coils. The inductive component of the electric field is produced by the time varying magnetic field, while the capacitive component of the electric field is produced by the RF voltage in the coils. The inductive electric field is azimuthal while the capacitive electric field is vertical to the workpiece. The current and voltage differ at different points because of transmission line effects of the coil at the frequency of the RF source.

For spiral designs as disclosed by and based on the Ogle '458 patent, the RF currents in the spiral coil are distributed to produce a toroidal shaped electric field resulting in a toroidal plasma close to the window, which is where power is absorbed by the gas to excite the gas to a plasma.. The toroidal shaped magnetic field is accompanied by a ring shaped electric field which generates a toroidal shaped plasma distribution. At low pressures, in the 1.0 to 10 mTorr range, diffusion of the plasma from the toroidal shaped region where plasma density is peaked tends to smear out plasma non-uniformity and increases plasma density in the chamber center just above the center of the workpiece. However, the diffusion alone generally can not sufficiently compensate plasma losses to the chamber walls and plasma density around the workpiece periphery can not be changed independently. At intermediate pressure ranges, in the 10 to 100 mTorr range, gas phase collisions of electrons, ions, and neutrals in the plasma further prevent substantial diffusion of the plasma charged particles from the toroidal region. As a result, there is a relatively high plasma density in a ring like region of the workpiece but low plasma densities in the center and peripheral workpiece portions.

These different operating conditions result in substantially large plasma flux (i.e., plasma density) variations between inside the toroid and outside the toroid, as well as at different azimuthal angles with respect to a center line of the chamber that is at right angles to the plane of the workpiece holder (i.e., chamber axis). These plasma flux variations result in a substantial standard deviation, i.e., in excess of six percent, of the plasma flux incident on the workpiece. The substantial standard deviation of the plasma flux incident on the workpiece has a tendency to cause non-uniform workpiece processing, i.e, different portions of the workpiece are etched to different extents and/or have different amounts of materials deposited on them.

Many coils have been designed to improve the uniformity of the plasma. The commonly assigned U.S. Pat. No. 5,759,280, Holland et al., issued Jun. 2, 1998, discloses a coil which, in the commercial embodiment, has a diameter of 12 inches and is operated in conjunction with a vacuum chamber having a 14.0 inch inner wall circular diameter. The coil applies magnetic and electric fields to the chamber interior via a quartz window having a 14.7 inch diameter and 0.8 inch uniform thickness. Circular semiconductor wafer workpieces are positioned on a workpiece holder about 4.7 inches below a bottom face of the window so the center of each workpiece is coincident with a center line of the coil and the chamber center line.

The coil of the '280 patent produces considerably smaller plasma flux variations across the workpiece than the coil of the '458 patent. The standard deviation of the plasma flux produced by the coil of the '280 patent on a 200 mm wafer in such a chamber operating at 5 milliTorr is a considerable improvement over the standard deviation for a coil of the '458 patent operating under the same conditions. The coil of the '280 patent causes the magnetic field to be such that the plasma density in the center of the workpiece is greater than in an intermediate part of the workpiece, which in turn exceeds the plasma density in the periphery of the workpiece. The plasma density variations in the different portions of the chamber for the coil of the '280 patent are much smaller than those of the coil of the '458 patent for the same operating conditions as produce the lower standard deviation.

Other arrangements directed to improving the uniformity of the plasma density incident on a workpiece have also concentrated on geometric principles, usually concerning coil geometry. See, e.g., U.S. Pat. Nos. 5,304,279; 5,277,751; 5,226,967; 5,368,710; 5,800,619; 5,401,350; 5,558,722, 5,795,429, 5,847,074 and 6,028,395. However, these coils have generally been designed to provide improved radial plasma flux uniformity and to a large extent have ignored azimuthal plasma flux uniformity. In addition, the fixed geometry of these coils does not permit the plasma flux distribution to be changed for different processing recipes. While we are aware that the commonly assigned co-pending U.S. application of John Holland for "Plasma Processor with Coil Responsive to Variable Amplitude RF Envelope," Ser. No. 09/343,246, filed Jun. 30, 1999, and Gates U.S. Pat. No. 5,731,565 disclose electronic arrangements for at will controlling plasma flux uniformity for different recipes, the Holland and Gates inventions are concerned primarily with radial, rather than azimuthal, plasma flux uniformity. In the Holland invention, control of the plasma flux uniformity is achieved by controlling a variable amplitude envelope the RF excitation source applies to the coil. In the Gates invention, a switch or a capacitor shunts an interior portion of a spiral-like RF plasma excitation coil.

The frequency, i.e., reciprocal of wavelength, (typically 13.56 MHz) of the RF power source driving the coil and the lengths of the coil are such that there are significant standing wave current and voltage variations along the length of a particular winding. Voltage magnitude can change from about 1,000 volts (rms) to nearly zero volts, while the standing wave current can change nearly 50%. Hence, there are peak voltage and current somewhere along the length of each winding. However, we are aware of prior art including an RF source that drives an electrically short plasma excitation coil.

Our U.S. Pat. No. 6,164,241, entitled "Multiple Coil Antenna for Inductively-Coupled Plasma Generation Systems," discloses another coil including two concentric electrically parallel windings each having first and second terminals, which can be considered input and output terminals of each winding. Each first terminal is connected via a first series capacitor to an output terminal of a matching network driven by an RF power source. Each second terminal is connected via a second series capacitor to a common ground terminal of the matching network and RF source. Each winding can include a single turn or multiple turns that extend circumferentially and radially in a spiral-like manner relative to a common axis of the two windings. Each winding is planar or three-dimensional (i.e., spherical or dome-shaped) or separate turns of a single winding can be stacked relative to each other to augment the amount of magnetic flux coupled by a particular winding to the plasma.

The value of the second capacitor connected between the second terminal of each winding and ground sets the locations of the voltage and current extrema (i.e., maximum and minimum) in each winding, as disclosed in Holland et al., U.S. Pat. No. 5,759,280, commonly assigned with the present invention. Controlling the value of the second capacitor of each winding controls the distribution of magnetic flux produced by the coil to the plasma and the plasma flux incident on the workpiece because the value of the capacitor determines the location of the maximum values of the RF standing wave current and voltage in each respective winding. The value of the first capacitor determines the maximum magnitude of the current and voltage standing waves in each winding. The values of the first capacitors are also adjusted to help maintain a tuned condition between the RF source and the load it drives, which is primarily the coil and the plasma load coupled to the coil. Adjusting the maximum magnitude and location of the standing wave current in each winding controls the plasma density in different radial and azimuthal regions of the chamber.

It is desirable, in certain instances, to maintain the current in one of the windings relatively constant while changing the current in the remainder of the coil. The RF current generates the magnetic field, and the time varying magnetic field in free space produces the inductive electric field, which in turn generates the plasma and induces a plasma "image" current which is the mirror image of the driving RF current. By maintaining the current in one of the windings relatively constant, the electric field produced by that winding and supplied to the plasma in the chamber remains relatively constant, despite variations in the electric field produced by the remainder of the coil and supplied to the plasma. Maintaining the electric field produced by one of the windings relatively constant while varying the electric field produced by the remainder of the coil and supplied to the plasma provides substantial control for the plasma density incident on the workpiece. Such control is particularly advantageous in connection with processing chambers operating with different recipes, which are performed without opening the vacuum chamber. Such chambers operate at different times under differing conditions. Examples of the different conditions are different processing gases, different pressures and different workpieces.

Consider a coil having first and second parallel, concentric windings respectively close to (1) the chamber periphery and (2) the chamber axis. The first and second windings respectively couple ring shaped electric fields to the peripheral portions of the chamber (close to the chamber wall) and to the chamber center. It is desirable, in certain instances, to maintain the current flowing in the outer winding substantially constant at times, while differing currents flow in the inner windings. This causes the outer winding to produce a substantially constant electric field in the chamber peripheral portions while the inner winding generates different electric fields in the chamber central region. Such a result is attained by simultaneously adjusting the overall impedance in each winding and the total power since these windings are closely coupled to both windings. Since these windings are closely coupled, the change of the overall impedance in each winding causes change in current splitting as well as power splitting between these windings. The current in each winding is changed as the impedance in any winding changes. Therefore, the current in one winding can be compensated by changing the total power in order to maintain constant current in that winding. The ability to maintain a constant electric field in the chamber peripheral portion results in an extra process control knob to maintain constant power deposition in that region and further maintain constant processing results (e.g. etch rate or deposition rate) on the peripheral portion of a workpiece. This process control is particularly useful to compensate changes due to process conditions. In other situations, particularly for other pressures, as discussed supra, it is desirable to maintain the electric field in the chamber center substantially constant at times while the amplitude of the electric field in a peripheral portion of the chamber is changed. This process control capability is particularly useful to compensate the plasma loss to chamber walls and electric coupling to the grounded portion of chamber walls.

It is accordingly an object of the present invention to provide a new and improved vacuum plasma processor and method of operating same wherein the plasma density incident on the workpiece can be controlled at will.

An additional object of the present invention is to provide a new and improved vacuum plasma processor and method of operating same wherein the plasma density incident on a workpiece has relatively high uniformity.

An additional object of the present invention to provide a new and improved vacuum plasma processor and method of operating same wherein plasma density incident on a workpiece of the processor has relatively high azimuthal uniformity.

A further object of the invention is to provide a new and improved vacuum plasma processor including a coil with plural parallel windings driven by a single RF source via a single matching network and having improved control for the electric and magnetic fields that are produced by the coil and coupled to plasma in the chamber.

SUMMARY OF THE INVENTION

In accordance with one aspect of the invention, there is an improved control method and apparatus for the distribution of electromagnetic fields coupled by a plasma excitation coil to a plasma in a vacuum plasma processor for processing a workpiece, wherein the coil includes plural parallel windings for coupling inductive electric fields to plasma in the chamber. In the method and apparatus, (a) the total amount of RF power applied to the plural windings is controlled so that for different distributions of electromagnetic fields, different amounts of total RF power are applied to the plural windings and (b) the amount of RF current applied to individual plural windings is controlled so that for different distributions of the electromagnetic fields, different amounts of RF current are applied to the individual windings.

In a preferred embodiment, the windings are arranged so (a) one of the windings is an exterior winding located so the electromagnetic fields generated by it are in proximity to a peripheral wall of the chamber, and (b) electromagnetic fields generated by the remainder of the coil are remote from the chamber peripheral wall. The RF current applied to the exterior winding is controlled so the electromagnetic fields generated by the exterior winding exceeds the electromagnetic fields generated by the remainder of the coil in one arrangement. In a second arrangement, the electromagnetic fields generated by the exterior winding is less than electromagnetic fields generated by the remainder of the coil. In another arrangement, which results in a very nearly uniform plasma density on the workpiece, the RF currents applied to the exterior winding and the remainder of the coil are somewhat equal.

By controlling the currents, the RF power coupled to one of the windings is maintained substantially constant for different electromagnetic fields distributions and the RF power coupled to another of the windings is changed for the different distributions. The power maintaining and changing operations are preferably performed by controlling the values of impedances associated with the individual windings and the total power applied to the coil. In one embodiment, each of the plural windings includes first and second terminals such that the first terminal is connected via a first series capacitor to an output terminal of a matching network driven by a source of the RF power and the second terminal is connected via a second series capacitor to the common ground terminal of the matching network. The values of the impedances are controlled by controlling the capacitance of at least one capacitor associated with each individual winding.

In one embodiment, the RF power has a frequency and the windings have lengths such that there are substantial standing wave current variations along the lengths of the individual windings. In such a configuration, the value of at least one capacitor associated with each winding is adjusted so that adjacent windings have standing wave RF current maxima that are radially opposite to each other.

In another aspect of the invention, the RF power has a frequency and the windings have lengths such that there are no substantial standing wave current variations along the lengths of the individual windings. In such a configuration, only one capacitor need be associated with each winding and its capacitance is adjusted to control the current amplitude flowing in the winding.

A further aspect of the invention involves positioning an exterior winding of the coil relative to the remainder of the coil to achieve substantially uniform plasma density on the workpiece. In particular, the exterior winding is turned about an axis of the coil, relative to the remainder of the coil which is substantially concentric with and inside the exterior winding.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWING

Figure 1:
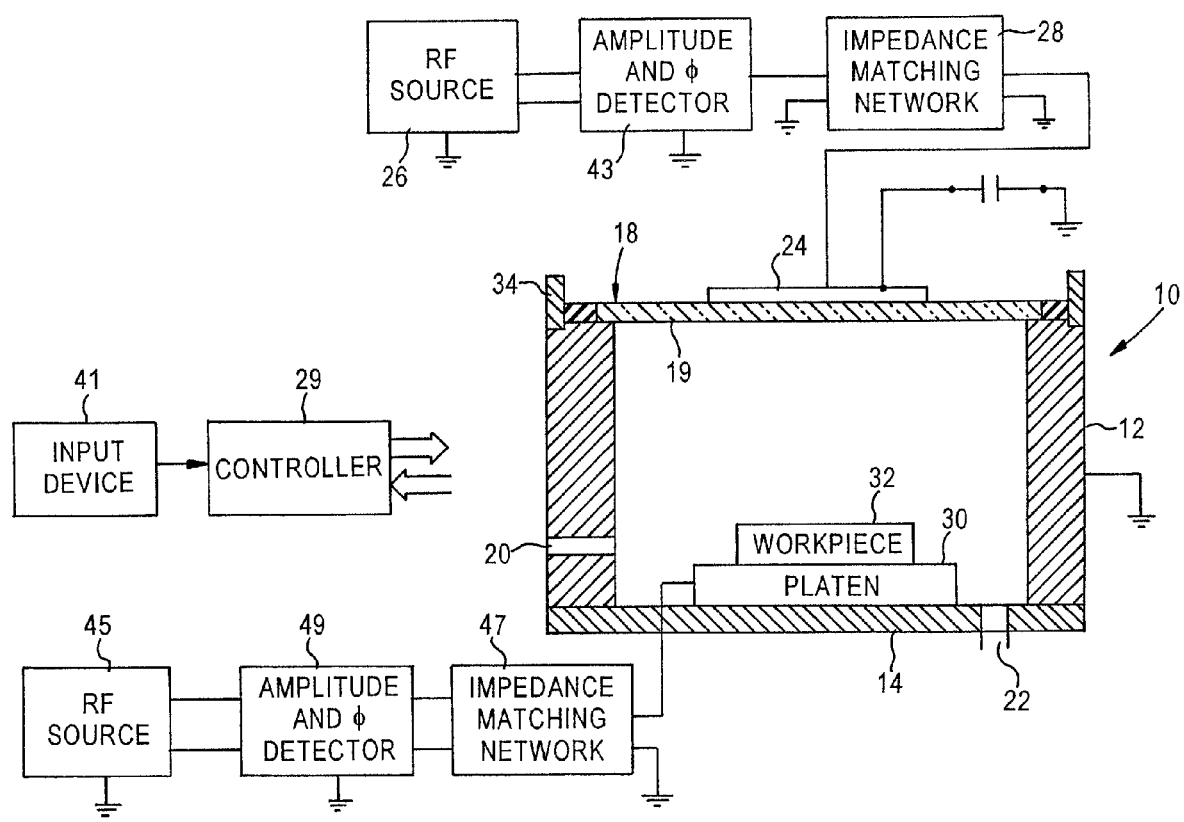
FIG. 1 is a schematic diagram of a vacuum plasma processor of the type employed in connection with the present invention.

The vacuum plasma workpiece processor of FIG. 1 of the drawing includes vacuum chamber 10, shaped as a cylinder having grounded metal wall 12, metal bottom end plate 14, and circular top plate structure 18, consisting of a dielectric window structure 19, having the same thickness from its center to its periphery. Sealing of vacuum chamber 10 is provided by conventional gaskets (not shown). The processor of FIG. 1 can be used for etching a semiconductor, dielectric or metal substrate or for depositing materials on such substrates.

A suitable gas that can be excited to a plasma state is supplied to the interior of chamber 10 from a gas source (not shown) via port 20 in side wall 12 and further distributed uniformly through a gas distribution mechanism (not shown). The interior of the chamber is maintained in a vacuum condition, at a pressure that can vary in the range of 1–1000 milliTorr, by a vacuum pump (not shown) connected to port 22 in end plate 14.

The gas in chamber 10 is excited by a suitable electric source to a plasma having a controlled spatial density. The electric source includes a planar or spherical or dome like coil 24, mounted immediately above window 19 and excited by variable power RF generator 26, typically having a fixed frequency of 13.56 MHz.

Impedance matching network 28, connected between output terminals of RF generator 26 and excitation terminals of coil 24, couples RF power from the generator to the coil. Impedance matching network 28 includes variable reactances which controller 29 varies in a known manner in response to indications of the amplitude and phase angle of the voltage reflected to the input terminals of the matching network, as sensed by detector 43. Controller 29 varies the values of the reactances in network 28 to achieve impedance matching between source 26 and a load including coil 24 and the plasma load the coil drives.

Controller 29 also responds to input device 41 to control variable reactances coupled to coil 24. Input device 41 can be a manual device, such as a potentiometer or keys of a key pad, or a microprocessor responsive to signals stored in a computer memory for different processing recipes of workpiece 32. Variables of the recipes include (1) species of gases flowing through port 20 into chamber 10, (2) pressure in chamber 10 controlled by the vacuum pump connected to port 22, (3) the total output power of RF source 26, which is substantially equal to the power, supplied to coil 24, and (4) the values of capacitors connected to coil 24.

Workpiece 32 is fixedly mounted in chamber 10 to a surface of workpiece holder (i.e., platen or chuck) 30; the surface of holder 30 carrying workpiece 32 is parallel to the surface of window 19. Workpiece 32 is usually electrostatically clamped to the surface of holder 30 by a DC potential that a DC power supply (not shown) applies to a chuck electrode (not shown) of holder 30. RF source 45 supplies the radio frequency electromagnetic wave to impedance matching network 47, that includes variable reactances (not shown). Matching network 47 couples the output of source 45 to holder 30. Controller 29 responds to signals that amplitude and phase detector 49 derives to control the variable reactances of matching network 47 to match the impedance of source 45 to the impedance of an electrode (not shown) of holder 30. The load coupled to the electrode in holder 30 is primarily the plasma in chamber 10. As is well known the RF voltage source 45 applies to the electrode of holder 30 interacts with charge particles in the plasma to produce a DC bias on workpiece 32.

Surrounding coil 24 and extending above top end plate 18 is a metal tube or can-like shield 34 having an inner diameter somewhat greater than the inner diameter of wall 12. Shield 34 decouples electromagnetic fields originating in coil 24 from the surrounding environment. The diameter of cylindrically shaped chamber 10 defines the boundary for the electromagnetic fields generated by coil 24. The diameter of dielectric window structure 19 is greater than the diameter of chamber 10 to such an extent that the entire upper surface of chamber 10 is comprised of dielectric window structure 19.

The distance between the treated surface of workpiece 32 and the bottom surface of dielectric window structure 19 is chosen to provide the most uniform plasma flux on the exposed, processed surface of the workpiece. For a preferred embodiment of the invention, the distance between the workpiece processed surface and the bottom of the dielectric window is approximately 0.2 to 0.4 times the diameter of chamber 10.

Coil 24 includes plural parallel windings each of which is electrically long enough at the 13.56 MHz frequency of source 26 to function as a transmission line having a total electric length of about 30 to 45° to produce standing wave patterns along the length of the winding. The standing wave patterns result in variations in the magnitude of standing wave RF voltages and currents along the lengths of the windings. The dependence of the magnetic fluxes generated by the windings on the magnitude of these RF currents results in different plasma density being produced in different portions of chamber 10 beneath different windings of coil 24.

The variations in the RF current magnitude flowing in different windings of the coil are spatially averaged to assist in controlling plasma density spatial distribution. Spatially averaging these different current values in the different windings of the coil can substantially prevent azimuthal asymmetries in the plasma density, particularly at regions of low RF current in the windings. Alternatively, the frequency of generator 26 is 4.0 MHz, in which case the windings of coil 24 are electrically short, about 10° to 15°, causing the standing wave currents and voltages in the windings to be substantially constant.

Controller 29 includes microprocessor 33 (FIG. 2) which responds to (1) input control 41, (2) voltage amplitude and phase angle signals that detector 31 derives, and (3) memory system 35 that stores programs for controlling microprocessor 33 as well as signals controlling the values of variable capacitors connected to coil 24 and the output power of RF generator 26. Among the programs memory system 35 stores are control programs for the values of the variable reactances of matching networks 28 and 47. The output power of source 26 and the values of capacitors connected to coil 24 can also be pre-set at the time the processor is made or installed, particularly if the processor is dedicated to a single recipe.

Figure 2:
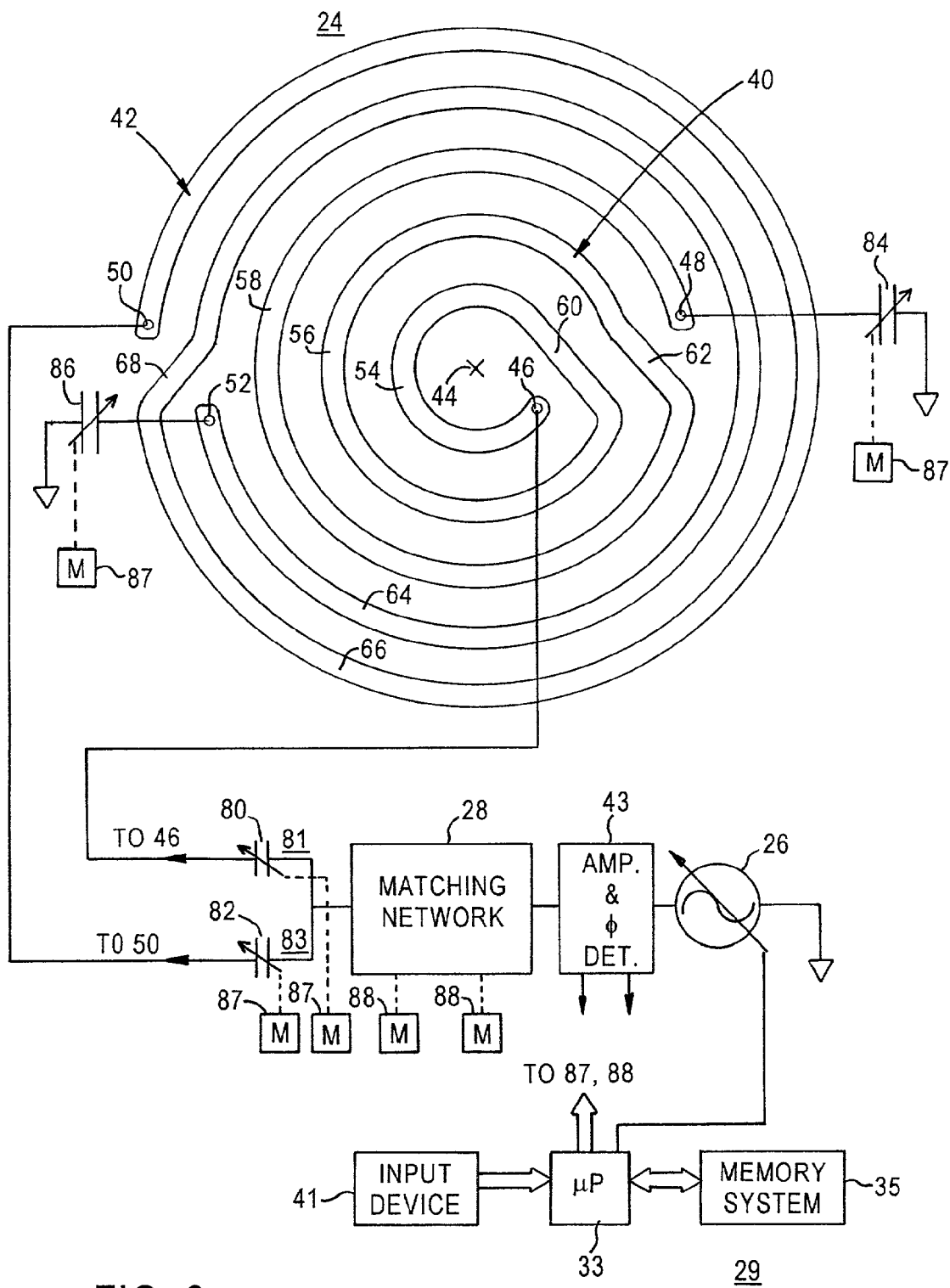
FIG. 2 is an electrical schematic diagram of a coil included in the processor of FIG. 1 in combination with an RF source, a matching network, and electronic control circuitry for -driving the coil and for controlling (1) the capacitances of variable capacitors connected to the coil and (2) the total power supplied to the coil.

As illustrated in FIG. 2, coil 24 includes two parallel windings 40 and 42, both of which are generally concentric with center coil axis 44 and include multiple spiral-like turns that extend radially and circumferentially with respect to axis 44. Interior winding 40 is wholly within exterior winding 42, such that winding 42 completely surrounds winding 40. Winding 40 includes interior terminal 46 and exterior terminal 48, while winding 42 includes exterior terminal 50 and interior terminal 52.

Interior winding 40 includes three concentric turns 54, 56 and 58 having different radii, as well as two straight segments 60 and 62. Each of turns 54, 56 and 58 is a segment of a circle centered on axis 44 and having an angular extent of about 340°. Adjacent ends of turns 54 and 56 are connected to each other by straight segment 60, while straight segment 62 interconnects adjacent ends of turns 56 and 58 to each other. Straight segments 60 and 62 extend radially and circumferentially along substantially parallel paths..

Exterior winding 42 includes two concentric turns 64 and 66 having different radii, as well as straight segment 68. Each of turns 64 and 66 is a segment of a circle centered on axis 44 and having an angular extent of about 340°. Straight segment 68 extends radially and circumferentially to connect adjacent ends of turns 64 and 66 to each other.

The sum of the lengths of turns 54, 56 and 58 and sectors 60 and 62 of winding 40 is about equal to the sum of the lengths of turns 64 and 66, as well as sector 68 of winding 42. Because windings 40 and 42 have substantially equal lengths, they have standing wave voltage and current variations along their length which are substantially the same, regardless of the frequency that generator 26 supplies to them.

Windings 40 and 42 of coil 24 are driven in parallel by RF current derived by a single fixed frequency RF generator 26, having a controlled variable output power. As described infra, at either the low (e.g. 4.0 MHz) or high (e.g. 13.56 MHz) frequency of generator 26, there is a single current maximum in each of windings 40 and 42. At the high frequency, the current maxima are at locations that are about half-way between the terminals of each winding. The current maxima occur at radially opposite points of the windings 40 and 42 relative to axis 44 to provide approximate azimuthal symmetry to the ring shaped electric field resulting from RF excitation of windings 40 and 42 by generator 26.

Windings 40 and 42 are respectively in separate parallel circuit branches 81 and 83. Branch 81 includes series connected winding 40 and variable capacitors 80 and 84, while branch 83 includes series connected winding 42 and variable capacitors 82 and 86. The turns of windings 40 and 42 of coil 24 are arranged so that input terminals 46 and 50, which are driven in the parallel by power from the output terminal of matching network 28, are on opposite sides of coil axis 44 so current flows in the same direction from terminals 46 and 50 into the remainder of windings 40 and 42. Terminal 46 is on the smallest radius turn 54 of coil 24 and terminal 58 is on the largest radius turn 66. Terminals 46 and 50 are respectively connected by series variable capacitors 80 and 82 to the output terminal of matching network 28.

Output terminals 48 and 52 of coil 24, which are diametrically opposite to each other relative to axis 44, are connected to the ground common terminals via series variable capacitors 84 and 86.

For the high frequency output of source 26, the values of capacitors 84 and 86 are set such that the standing wave currents in windings 40 and 42 have minimum amplitudes at the input and output terminals 46 and 48 of winding 40 and at terminals 50 and 52 of winding 42, where the standing wave voltages are at maxima. The standing wave currents in windings 40 and 42 have maximum values at radially opposite points of windings 40 and 42, were the standing wave voltages are at minima, a result achieved by adjusting the values of capacitors 84 and 86. The standing wave current maximum can be located by monitoring the standing wave voltages. The current maximum occurs at a place where the voltage is a minimum (close to zero volt). Locating the standing wave current maxima in windings 40 and 42 to be radially opposite to each other assists in providing azimuthally symmetric plasma density.

The values of capacitors 80 and 82 help keep the impedance of each of windings 40 and 42 tuned to matching network 28. The maximum amplitudes of the standing wave currents in windings 40 and 42 are respectively controlled by the values of capacitors 80 and 82. The physical configuration of windings 40 and 42 and the location of terminals 46, 48, 50 and 52 affect the positions of the maximum standing wave currents in windings 40 and 42.

Proper control of the values of capacitors 80, 82, 84 and 86, as well as the total output power of generator 26, i.e., the power that generator 26 applies in parallel to windings 40 and 42, enables the current in one of windings 40 or 42 to remain substantially constant, while providing changes of the current in the other winding. The ability to vary the total power while maintaining the current in one of windings 40 or 42 substantially constant provides substantial control over the electromagnetic field distribution resulting from energization of the windings. By maintaining the current in one of windings 40 or 42 substantially constant, the electromagnetic field produced by that winding, and supplied to the plasma in chamber 10 remains relatively constant. Changing the current in the other winding 40 or 42 causes the electromagnetic field that winding supplies to the plasma in chamber 10 to vary. As described previously, different workpiece processing recipes require the electromagnetic power deposited by winding 40 to remain substantially constant and the power that winding 42 couples to the plasma to be varied. For other recipes, it is desirable for the power distribution that winding 42 supplies to the plasma in chamber 10 to remain constant and the power that branch 40 supplies to the plasma in chamber 10 to be varied.

The values of capacitors 80, 82, 84 and 86, as well as the output power of generator 26, are controlled for different recipes by manual adjustment of these parts or by automatic adjustment thereof in response to signals stored in memory system 35 being read out by microprocessor 33 in response to recipe signals from input controller 41. Alternatively, if a particular coil always operates in connection with a processor that always operates with the same recipe, the values of capacitors 80, 82, 84 and 86, as well as the output power of generator 26, can be set at the factory, at the time the processor is manufactured, or during installation of the processor.

Assume each of windings 40 and 42 typically has a resistance of 6 ohms, which enables the RMS (root mean squared) current in winding 42 to be maintained substantially constant and the RMS current in winding 40 to be varied by adjusting the output power of generator 26 and the total reactances ($X_1$) and ($X_2$) of branches 81 and 83 to be in accordance with Table I:

TABLE I

| | | ($R_1 = R_2 = 6\Omega$) | | | |
|---|---|---|---|---|---|
| ↓Cases | | $P_{tot}$ (W) | $X_1$ ($\Omega$) | $X_2$ ($\Omega$) | $I_1$ (A) | $I_2$ (A) |
| a) | Equal currents in 40 and 42 | 1000 | 40 | 40 | 9.13 | 9.13 |
| b) | Larger current in 40 than 42 | 1570 | 20 | 30 | 13.36 | 9.12 |
| c) | Lower current in 40 than 42 | 850 | 60 | 50 | 7.63 | 9.14 |

Similarly, if it is desired to maintain a substantially constant current in interior winding 40 and a variable current in outer winding 42, the reactances of branch 81 ($X_1$) and branch 82 ($X_2$) and the output power of generator 26 are adjusted in accordance with Table II.

TABLE II

| | | ($R_1 = R_2 = 6\Omega$) | | | |
|---|---|---|---|---|---|
| ↓Cases | | $P_{tot}$ (W) | $X_1$ ($\Omega$) | $X_2$ ($\Omega$) | $I_1$ (A) | $I_2$ (A) |
| a) | Equal currents in 40 and 42 | 1000 | 40 | 40 | 9.13 | 9.13 |
| b) | Larger current in 40 than 42 | 1570 | 30 | 20 | 9.12 | 13.36 |
| c) | Lower current in 40 than 42 | 850 | 50 | 60 | 9.14 | 7.63 |

By varying the values of capacitors 80, 82, 84 and 86, as well as the power of source 26, control of the plasma density incident on workpiece in both the azimuthal and radial coordinate directions is achieved.

The following analysis of branches 81 and 82 provides a quantitative insight into deriving appropriate values for impedances associated with the branches.

Assume the currents and the impedances are $I_1$ and $z_1$, respectively for branch 81, and are $I_2$ and $z_2$, respectively for branch 83. Since each branch consists of the series combination of an input capacitor, a winding and an output capacitor, the impedance $z_1$ or $z_2$ is the lump sum of all the impedances from the input ($C_1$ or $C_2$) and the output ($C_3$ or $C_4$) capacitors, and the winding ($L_1$ or $L_2$) for branch 81 or branch 83. Thus $z_1 = R_1 + j[\omega L_1 - 1/(\omega C_1) - 1/(\omega C_3)] = R_1 + jX_1$, where $R_1$ and $X_1 = \omega L_1 - 1/(\omega C_1) - 1/(\omega C_3)$ respectively represent the real (resistive) and imaginary (reactive) parts of impedance $z_1$. Similarly, $z_2 = R_2 + j X_2$, where $R_2$ and $X_2=\omega L_2-1/(\omega C_2)-1/(\omega C_4)$ respectively represent the resistive and reactive parts of impedance $z_2$. Let V be the RF voltage across either branch; I be the total current supplied to branches 81 and 83; $P_{tot}$ be the total power dissipated in the two branches, i.e., the output power of source 26; and z be the overall impedance of the two branches. Because branches 81 and 83 are in parallel $$z = \frac{z_1 z_2}{z_1 + z_2} = \frac{(R_1 + jX_1)(R_2 + jX_2)}{(R_1 + R_2) + j(X_1 + X_2)} \quad (1)$$

The impedance given by Equation (1) can be rewritten as $z=|z|e^{j\omega}=R+jX$, where R is the overall real component of coil 24, i.e., of windings 40 and 42 in parallel with each other and is obtained from Equation (1) as:

$$R = \frac{(R_1 + R_2)(R_1 R_2 - X_1 X_2) + (X_1 + X_2)(R_1 X_2 + R_2 X_1)}{(R_1 + R_2)^2 + (X_1 + X_2)^2} \quad (2)$$

$$= \frac{R_1(R_2^2 + X_2^2) + R_2(R_1^2 + X_1^2)}{(R_1 + R_2)^2 + (X_1 + X_2)^2} \quad (2a)$$

From Equation 2(a), R is more sensitive to changes of $R_1$ and $R_2$ than to changes of $X_1$ and $X_2$.

Then $P_{tot}$ is given by $$P_{tot} = \frac{1}{2}V_o I_o \cos\varphi = \frac{1}{2}I_o^2|z|\cos\varphi = \frac{1}{2}I_o^2 R = I_{rms}^2 R \quad (3)$$

where $V_O$ and $I_O$ are respectively peak amplitudes of the voltage and current matching network 28 applies to coil 24, $I_{rms}$ is the rms current I matching network 28 applies to coil 24, and $\phi$ is the phase difference between the voltage and current matching network 28 applies to coil 24 since $V/I=z=|z|e^{j\Phi}$. Moreover $V_O=I_O|z|$ and $I_{rms}=I_O/\sqrt{2}$.

The current $I_1$ in branch 81 can be calculated from Equations (1) and (3), as $$I_1 = \frac{V}{z_1} = \frac{Iz}{z_1} = \frac{z_2}{z_1 + z_2}I \quad (4)$$

The rms value of $I_1$ is obtained by substituting Equations (2) and (3) into (4)

$$I_1(\text{rms}) = \left|\frac{z_2}{z_1 + z_2}\right| I_{\text{rms}} = \sqrt{\frac{R_2^2 + X_2^2}{(R_1 + R_2)^2 + (X_1 + X_2)^2} \cdot \frac{P_{tot}}{R}} \quad (5)$$

Similarly, $$I_2(\text{rms}) = \left|\frac{z_1}{z_1 + z_2}\right| I_{\text{rms}} = \sqrt{\frac{R_1^2 + X_1^2}{(R_1 + R_2)^2 + (X_1 + X_2)^2} \cdot \frac{P_{tot}}{R}} \quad (6)$$

Equations (5) and (6) clearly show that the currents in branches 81 and 83, and windings 40 and 42 are coupled.

For a given constant total power P of source 26, as $X_1$ increases (by decreasing the value of the input capacitor 80 in branch 81), $I_1$ decreases while $I_2$ increases. Since R (from Equation 2(a)) changes very little as $X_1$ or $X_2$ changes, R can be approximately treated as a constant in the discussion here.

Figure 3:
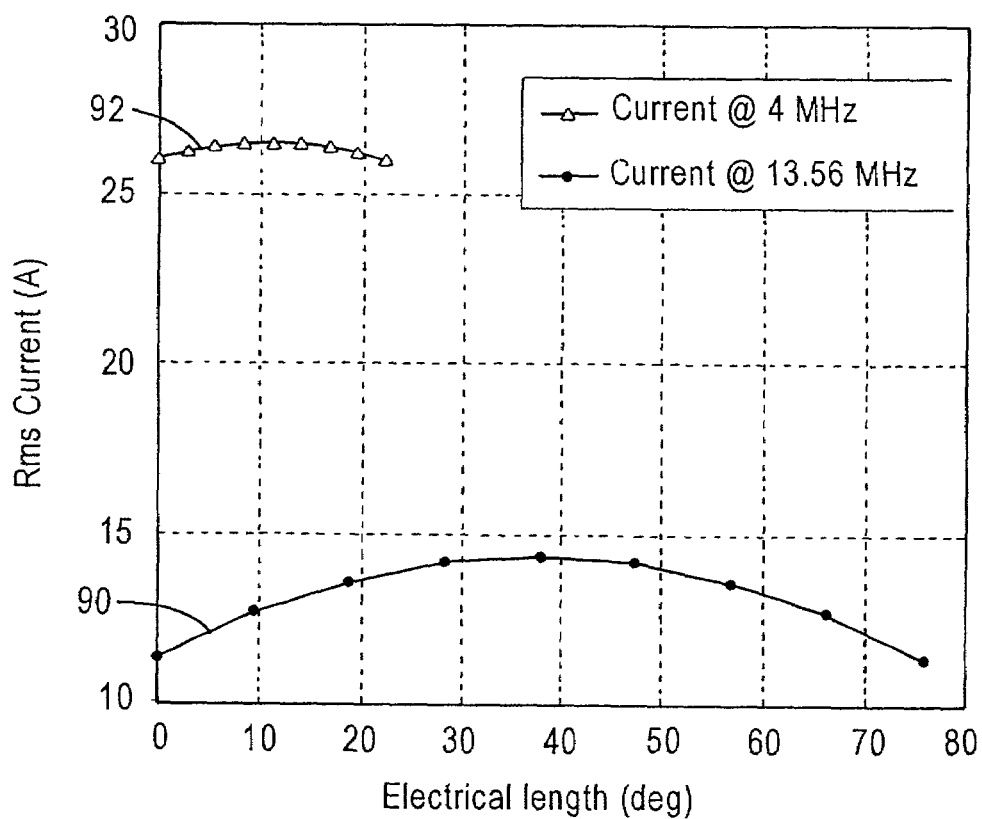
FIG. 3 includes calculated amplitudes of standing wave currents in the windings of the coil illustrated in FIG. 2 for excitations at 13.56 MHz and 4.0 MHz.

For simplicity, assume the frequency of RF source 26 is 13.56 MHz and the electrical length of each of branches 40 and 42 is 77° at 13.56 MHz and the values of capacitors 80, 82, 84 and 86 are properly adjusted so there are equal currents in windings 40 and 42, For such a situation, the standing wave current amplitudes along the lengths of each of windings 40 and 42 are as depicted by curve 90, FIG. 3. Curve 90 has a sinusoidal-like variation between the input and output terminals of each of windings 40 and 42. Curve 90 has a peak value of approximately 14.5 amperes RMS at the midpoint of the curve, i.e., at 38°, and minimum equal values of about 10.7 amperes RMS at the input and output terminals of windings 40 and 42. Thus, the maximum standing wave current in each of windings 40 and 42 exceeds the minimum standing wave current by approximately 3.8 amperes RMS, i.e., by about 21%.

A possible problem with operating the arrangement of FIG. 2 at a frequency of 13.56 MHz is that capacitors 80, 82, 84 and 86 might have to be adjusted simultaneously or in an iterative manner to maintain the desired relationship for the electromagnetic field distributions derived from windings 40 and 42. For example, to maintain an azimuthally symmetric density on the workpiece, requires the maximum currents in each coil to be located radially opposite to each other relative to axis 44. This is achieved by adjusting the values of capacitors 84 and 86 connected between the output terminals of windings 40 and 42 and ground. Adjusting the values of capacitors 84 and 86 may require adjustment of capacitors 80 and 82 to provide the desired values of standing wave current to achieve the values indicated in Tables I and II. However, adjusting the values of capacitors 80 and 82 can cause a further shift in the current standing wave patterns in windings 40 and 42, whereby the maxima of the current standing wave patterns are no longer diametrically opposed relative to coil axis 44. If the current standing wave maxima are shifted in this manner, further adjustment of the values of capacitors 84 and 86 may be necessary.

To overcome this problem, we have realized that if the current variations along windings 40 and 42 can be substantially reduced, such that the location of the standing wave current maxima in windings 40 and 42 is not critical, i.e., the maxima do not have to be on diametrically opposite sides of coil axis 44, that only a single variable capacitor need be connected to each of windings 40 and 42. In other words, the necessity to simultaneously or iteratively adjust all four capacitors 80, 82, 84 and 86 would be obviated.

To these ends, one embodiment of the invention involves reducing the frequency of RF source 26 so that the transmission line effects of windings 40 and 42 are substantially reduced. If the electrical length of each of windings 40 and 42 is substantially less than about 45°, the percent change between the maximum and minimum values of the standing wave current is reduced sufficiently to enable only a single variable capacitor 84 and 86 to be connected in series with windings 40 and 42, respectively, and the need for any capacitor to be connected between each winding input terminal and the power output terminal of matching network 28 is obviated.

As mentioned previously, in one preferred embodiment, the frequency of RF source 26 is reduced to 4.0 MHz from 13.56 MHz, resulting in a decrease in the electrical length of windings 40 and 42 by a factor of 3.4. Curve 92, FIG. 3, represents the situation of capacitors 84 and 86 being adjusted so equal standing wave currents are in windings 40 and 42. The same physical windings that are analyzed at 13.56 MHz (shown in curve 90) are re-analyzed at 4.0 MHz (shown in curve 92). The electrical length of each of branches 40 and 42 becomes 22.6° (i.e., 77°/3.4). Curve 92 has standing wave current minima of approximately 25.7 amperes RMS at the input and output terminals of windings 40 and 42 and a maximum standing wave current of approximately 26 amperes RMS at the centers of the windings. Despite the fact that substantially larger current flows in windings 40 and 42 for the short transmission line situation of curve 92 than for the long transmission line situation of curve 90, the output power of source 24 was the same, 2400 watts, for both situations. For the exemplary equal current curves 90 and 92 of FIG. 3, the capacitances of capacitors 84 and 86 are equal to each other and have a value of 137 picofarads (pF) for the 13.56 MHz frequency of source 26, while the values of capacitors 84 and 86 are 1808 pF for the 4.0 MHz excitation of source 26.

The percentage change between the maxima and maximum standing wave currents of curve 92 is about 2%, in contrast with the 21% change of curve 90. Because a relatively low frequency of excitation source 26 results in a relatively small change between the minima and maximum standing wave currents of windings 40 and 42, there is a relatively uniform azimuthal electric field produced by each of windings 40 and 42 to the plasma in chamber 10. Consequently, the need to include capacitors 80 and 82, to adjust the position of the maximum standing wave currents in windings 40 and 42 does not exist. Tables I and II provide the information necessary for the low frequency excitation to adjust the capacitances of capacitors 84 and 86 and the output power of RF source 26 to achieve constant currents in coils 40 and 42, respectively.

The ratio $(I_1/I_2)$ of the maximum standing wave currents in windings 40 and 42 can be varied continuously from 20:1 to 1:1, then from 1:1 to 1:10, for the 4.0 MHz excitation power of source 26, by adjusting the value of capacitor 84, while maintaining the value of capacitor 86 constant, and then by adjusting the value of capacitor 86, while maintaining the value of capacitor 84 constant, where $I_1$ is the maximum standing wave current in winding 40 and $I_2$ is the maximum standing wave current in winding 42. As the values of capacitors 84 and 86 are varied, the output power of source 26 is varied to provide the same effects as indicated by Tables I and II.

To control the values of capacitors 80, 82, 84 and 86, in response to output signals of microprocessor 33, each of the capacitors is driven by a different one of DC motors 87. Each of motors 87 responds to a different output signal of microprocessor 33. The signals microprocessor 33 supplies to motors 87 have values commensurate with the amount that the output shafts of the motors are to be turned to achieve the desired capacitance values of capacitors 80, 82, 84 and 86. Matching network 28 includes variable reactances (preferably capacitors, FIG. 4) which are driven by motors 88. Motors 88 respond to different signals microprocessor 33 derives in response to signals derived by a program stored by memory system 35 and detector 43. Detector 43 derives signals representing (1) the voltage amplitude reflected by matching network 28 toward generator 26 and (2) the difference in phase between the reflected voltage and current. Microprocessor 33 supplies a suitable DC signal to generator 26 to control the generator output power. Microprocessor 33 responds to signals indicative of the voltage applied in parallel to branches 81 and 83 and by RF source 26 and matching network 28, as well as signals indicative of the standing wave currents at the output terminals 48 and 52 of branches 81 and 83, as derived by circuitry described in connection with FIG. 4.

Figure 4:
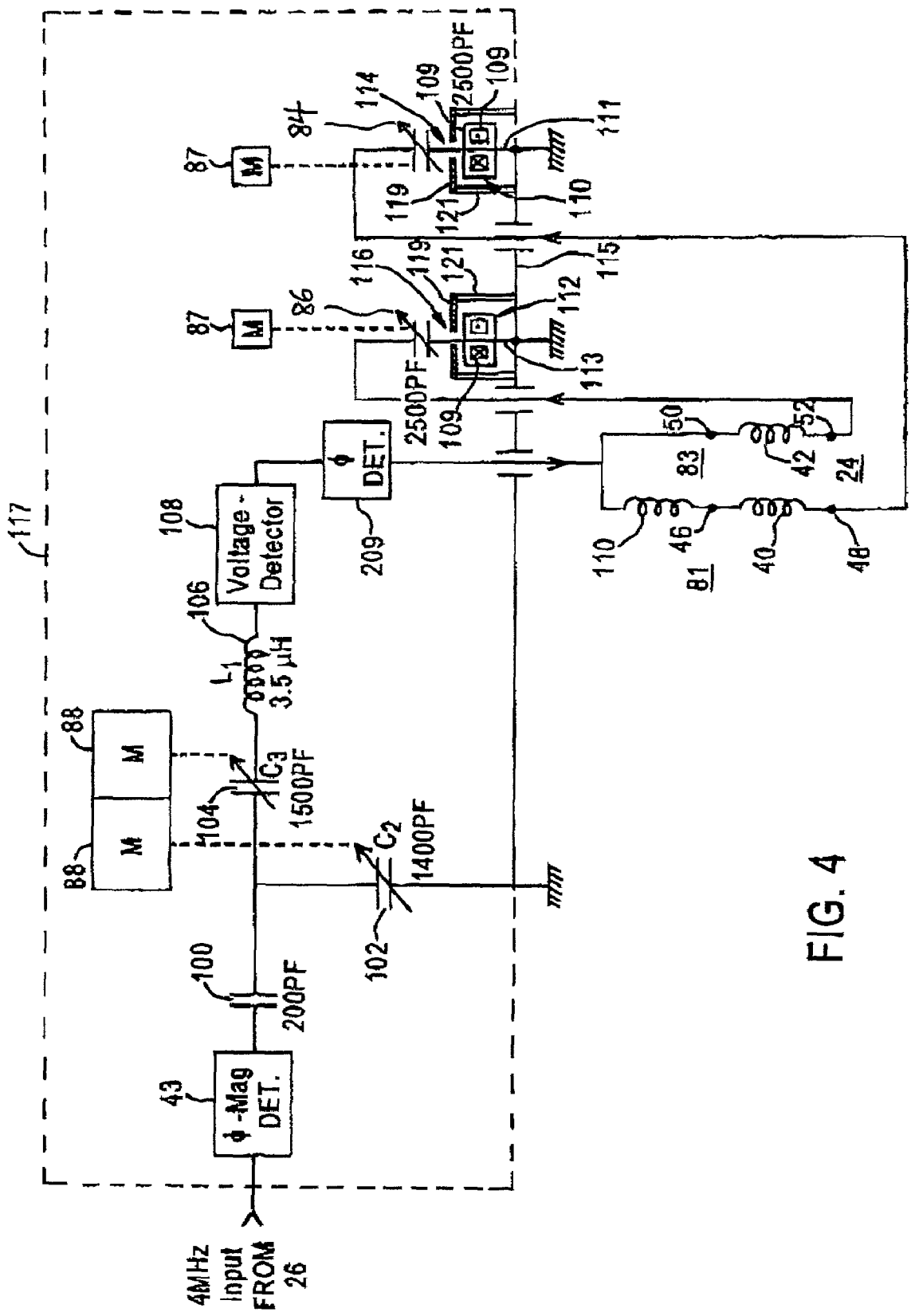
FIG. 4 is a circuit diagram of the matching network with current sensors for driving the coil of FIG. 2.

Reference is now made to FIG. 4 of the drawing, a circuit diagram of a preferred embodiment of electronic circuitry associated with 4.0 MHz drive of coil 24. RF source 26 drives matching circuit 28 via phase and magnitude detectors 43 and fixed series capacitor 100, preferably having a capacitance of 2000 pF. Matching network 28 includes variable shunt capacitor 102 and variable series capacitor 104 having capacitance values which are varied by motors 88.

The output power of matching circuit 28 is coupled in parallel to branches 81 and 83 via series inductor 106, RF voltage detector 108 and phase detector 109. RF voltage detector 108 derives a DC voltage indicative of the peak amplitude of the RF voltage at the joint input terminals of branches 81 and 83, while phase detector 109 derives a DC voltage indicative of the difference in phase between the RF voltage and current at the joint input terminals of branches 81 and 83. The output voltages of detectors 108 and 109 are fed back to microprocessor 33 which in turn controls motors 87 and the output power of generator 26 to achieve the previously discussed results. The currents flowing through branches 81 and 83 are respectively coupled to ground via variable capacitors 84 and 86.

The magnitudes of standing wave currents at output terminals of branches 81 and 83 are respectively detected by current amplitude sensors 110 and 112, respectively inductively coupled to wire leads 111 and 113 that are connected between the low voltage electrodes of capacitors 84 and 86 and ground. Each of current sensors 110 and 112 includes a current transformer including toroidal coil 109 having a central opening through which the wire leads 111 and 113 extend to provide the inductive coupling. Each of current sensors 110 and 112 also includes a rectifier and low-pass filter for supplying to microprocessor 33 a DC current indicative of the currents respectively flowing through terminals 48 and 52.

Grounded electromagnetic shields 114 and 116 are respectively interposed between current sensors 110 and 112 and capacitors 84 and 86 to minimize electromagnetic interference from RF fields of the remaining apparatus, particularly from windings 40 and 42. Shield 114 or 116 consists of a ring-shaped metal plate 119 and shield 121. Shield 119 has an opening for lead 111 or 113 to run through. Shield 121 is a metal cylinder which horizontally encloses sensor 110 or 112 and lead 111 or 113. Together with shield 119 and plate 115, which vertically sandwich the sensor, sensor 110 and 112 and lead 111 or 113 are completely shielded from ambient RF fields, thereby greatly improving the accuracy of the current sensor. Shields 119 and 121 are preferably made of silver-plated copper. Shield 121 is mechanically and electrically connected only to plate 115. All the voltages at the output terminals of windings 40 and 42 are across capacitors 84 and 86 so end plates 142 of the capacitors connected to leads 111 and 113 are virtually at ground. Shields 114 and 116 and current detectors 110 and 112 are arranged together with detector 43, capacitors 100, 102 and 104, coil 106 and detectors 108 and 109 in metal housing 117. The details of the current sensors 110 and 112 and shields 114 and 116 are described by our co-pending application Ser. No. 09/820,709 entitled "INDUCTIVE PLASMA PROCESSOR INCLUDING CURRENT SENSOR FOR PLASMA EXCITATION COIL".

Each of capacitors 84, 86, 100, 102 and 104 is a vacuum capacitor capable of handling relatively large currents which flow from RF source 26 to windings 40 and 42. Because of the relatively short electrical length of each of windings 40 and 42 at 4 MHz, relatively large capacitance values are required for capacitors 84 and 86, with typical maximum values of the capacitors being 2500 pF. Shunt load capacitor 102 has a relatively large maximum value of 1400 pF to match the low impedance of parallel branches 81 and 83. Series capacitor 104 is a relatively large capacitor, having a maximum value of 1500 pF to tune the low inductive reactances of parallel branches 81 and 83.

Fixed input series connected capacitor 100, preferably having a value of 200 pF, provides part of the impedance transformation between source 26 and the parallel windings 40 and 42 of coil 24. Capacitor 100 is included to enable shunt, load capacitor 102 to have a more reasonable value; otherwise, capacitor 102 would have a considerably higher capacitance value than the values associated with a capacitor having a maximum value of 1400 pF. Fixed capacitor 100 also provides better tuning resolution, to attain better resonant tuning of matching circuit 28 with parallel windings 40 and 42 of coil 24.

Fixed inductor 106, preferably having a relatively large value of 3.5 microhenries, extends the tuning range of matching network 28. Inductor 110, which is outside housing 117 and is optionally connected to interior winding 40, can be employed to provide substantially equal impedances for the parallel branches 81 and 83 associated with windings 40 and 42. Inductor 110 is used if winding 42 has an inductance substantially greater than the inductance of winding 40.

Voltage detector 108 and current sensors 110 and 112 supply signals to microprocessor 33. Microprocessor 33 responds to the signals from voltage detector 108, current sensors 110 and 112 and the phase indication detector 109 and derives the total output power RF source 26. The indication of total power is used to control the output power of RF generator 26 to enable the powers indicated by Tables I and II to be achieved. The signals that current sensors 110 and 112 derive are used by microprocessor 33 to control the motors which vary the capacitances of capacitors 84 and 86 to assure that the correct currents are flowing in windings 40 and 42 to achieve the currents specified in Tables I and II.

Figure 5:
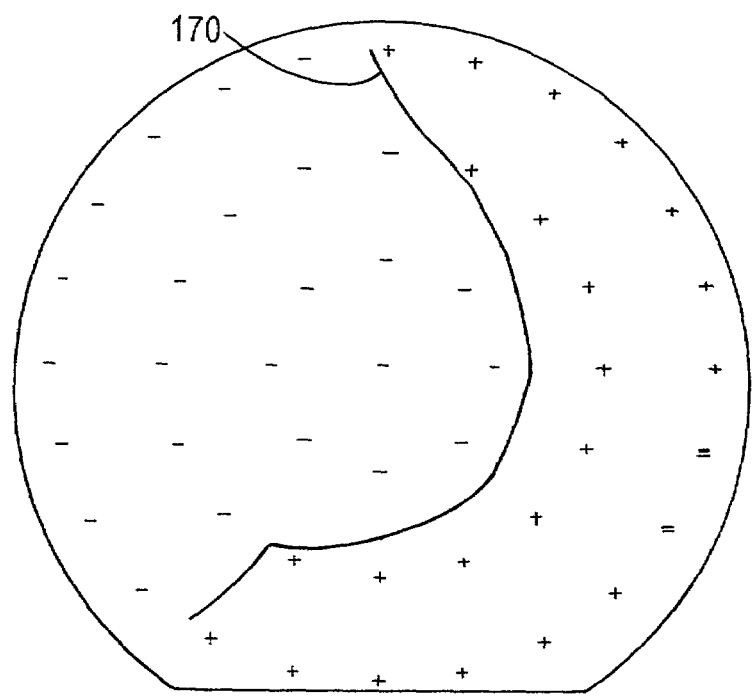
FIG. 5 is a sputter rate contour plot resulting from use of the apparatus of FIGS. 1, 2 and 4.

FIG. 5 is a contour plot of sputter rate on an 8-inch semiconductor wafer uniformly covered by an oxide layer. The plot resulted from an inductive discharge using windings 40 and 42 shown in FIG. 2. Windings 40 and 42 were driven by a 1500 watt output of generator 26, at a frequency of 4 MHz. The electrode in chuck 30 was driven by a 1400 watt output of source 45 at a frequency of 4 MHz, creating a DC bias of −375V in the chemistries of 85 sccm (cm$^3$/minute) of Ar and 100 sccm of $O_2$ with a total pressure of 5 mTorr. Capacitors 80 and 82 were omitted and capacitors 84 and 86 were adjusted so the ratio of standing wave maximum currents in inner winding 40 ($I_1$) to that in outer winding 42 ($I_2$) is fixed at $I_1/(I_2)$=1.4:1.9. The powers dissipated in the inner winding and in the outer winding are roughly balanced. The sputter rate contour plot indicates a uniform plasma density. The spatially averaged sputter rate indicated by line 170 is 1211 angstroms/minute and standard deviation is 3.2%. The "+" sign in FIG. 5 indicates a sputter rate higher than the average while the "−" sign denotes a sputter rate lower than the average. The equipment that produced the contour plot of FIG. 5 produces contours for each 50 angstroms of etched material. Since there is only one contour line in FIG. 5, etching was within ±50 angstroms of average contour line 170. By changing the ratio ($I_1/I_2$) of current in the inner and the outer windings 40 and 42 so it is higher than unity, about unity and less than unity, the plasma density incident on the workpiece is varied radially from dense in the center, to uniform, and to dense in the outer edge.

When the processor is being made, interior winding 40 is turned relative to exterior winding 42 to assist in controlling the azimuthal electric field distribution and the azimuthal plasma density distribution. Winding 40 is turned about axis 44 so terminals 46 and 48 are at different positions relative to terminals 50 and 52. In other words, terminals 46 and 48 can be at locations different from those illustrated in FIG. 2. Winding 40 can be turned to a predetermined position if the processors of the same type have consistent azimuthal electric field and plasma density distributions from processor to processor. If, however, different processors of the same type have differing azimuthal electric field and plasma density distributions from processor to processor, winding 40 is turned relative to winding 42 until tests indicate optimum uniform plasma distribution is achieved in each particular processor.

While there have been described and illustrated specific embodiments of the invention, it will be clear that variations in the details of the embodiments specifically illustrated and described may be made without departing from the true spirit and scope of the invention as defined in the appended claims. For example, many of the principles of the invention are not limited to coils having two concentric windings but are applicable to coils having three or more windings.

What is claimed is:

1. An inductive plasma processor for processing a workpiece, comprising a plasma excitation coil, the coil including plural parallel connected windings, a source for supplying power to the plural parallel connected windings, the source being connected to the plural parallel connected windings for causing current from the source to flow in parallel to the plural parallel connected windings, variable impedance arrangements respectively coupled with the plural parallel connected windings for varying the currents flowing from the source to each of the plural parallel connected windings, and a controller coupled to the source and components for (a) directly varying the total output power of the source and the total power the source supplies to the plural parallel connected windings and (b) varying values of components of the variable impedance arrangements so that for different distributions of electromagnetic fields the source is arranged to supply different amounts of total power and different relative currents to the plural parallel connected windings wherein the source is an RF source and the controller is arranged for varying the total power and the variable impedance arrangements so that for different distributions of electromagnetic fields generated by and supplied by the different windings to the plasma the current flowing in one of the windings remains substantially constant and the current in the remainder of the coil changes, each of the windings including first and second end terminals and each of the impedance arrangements including first and second variable capacitors, each of the first capacitors being connected in series with its respective first terminal for supplying RF energy from the RF source to the respective winding, each of the second capacitors being connected in series between its respective second terminal and ground, the controller being arranged for varying the values of the first and second variable capacitors.

2. The processor of claim 1 wherein each of the impedance arrangements includes a variable reactance coupled to its respective winding, the variable reactance of each impedance arrangement being arranged for varying the location of the maximum amplitude of a standing wave current in its respective winding, the controller being arranged for varying the values of the variable reactance of each impedance arrangement.

3. The processor of claim 2 wherein the source is an RF source, the frequency of the RF source and the length of the windings are such tat there are substantial standing wave current variations along the length of each winding.

4. The processor of claim 1 wherein each of the impedance arrangements includes a variable reactance coupled to its respective winding, the variable reactance of each impedance arrangement being arranged for varying the value of the maximum amplitude of a standing wave RF current in its respective winding, the controller being arranged for varying the value of the variable reactance of each impedance arrangement.

5. The processor of claim 4 wherein the source is an RF source, the frequency of the RF source and the length of the windings being such that there are no substantial standing wave current variations along the length of each winding.

6. The processor of claim 1 wherein the source is an RF source, each of the windings including first and second end terminals and each of the impedance arrangements includes first and second variable capacitors, each of the first capacitors being connected in series with its respective first terminal for supplying RF energy from the RF source to the respective winding, each of the second capacitors being connected in series between its respective second terminal and ground, the controller being arranged for varying the values of the first and second variable capacitors.

7. The processor of claim 6 wherein the first and second capacitors are arranged so their values control the magnitude and location of the maximum amplitude of a standing wave RF current in their respective winding.

8. The processor of claim 1 wherein the source is an RF source, the frequency of the RF source and the length of the windings being such that there are no substantial standing wave current variations along the length of each winding, and each variable impedance arrangement includes a single variable reactance coupled with each winding, the controller being arranged for varying the value of the variable reactance to control the maximum amplitude of the standing wave current in each winding.

9. The processor of claim 8 wherein the source is an RF source, the RF source frequency and the lengths of the windings are such that there are no substantial standing wave current variations along the length of each winding, the reactance coupled with each winding being arranged for controlling the value of the standing wave current in the respective winding.

10. A vacuum plasma processor for processing a workpiece, comprising a plasma excitation coil, the coil including plural parallel connected windings, a source for supplying power to the plural parallel connected windings, the source being connected to the plural connected windings for causing different parallel currents from the source to flow in the plural parallel connected windings, impedance arrangements respectively coupled with the plural parallel connected windings, the power of the source and the values of reactances of the impedance arrangements being such that (a) the maximum amplitude of a standing wave current in one of the windings differs from the maximum amplitude of a standing wave current in the remainder of the coil and (b) adjacent windings have standing wave current maxima that are radially opposite from one another.

11. The processor of claim 10 wherein each of the windings is arranged for coupling an electromagnetic field to plasma in the chamber, one of the windings being an exterior winding located so electromagnetic fields generated by it is in proximity to a peripheral wall of the chamber, the remainder of the coil being arranged so electromagnetic fields generated by the remainder of the coil are remote from the chamber peripheral wall, the controller being arranged to cause the values of the total power the source supplies to the coil and of the reactances to be such that the electromagnetic field generated by the exterior winding exceeds the electromagnetic field generated by the remainder of the coil.

12. The processor of claim 10 wherein each of the windings is arranged for coupling an electromagnetic field to plasma in the chamber, one of the windings being an exterior winding located so an electromagnetic field generated by it is in proximity to a peripheral wall of the chamber, the remainder of the coil being arranged so electromagnetic fields generated by the remainder of the coil are remote from the chamber peripheral wall, the controller being arranged to cause the values of the total power the source supplies to the coil and the reactances to be such that the electromagnetic field generated by the exterior winding is less than the electromagnetic field generated by the remainder of the coil.

13. The processor of claim 10 wherein each of the plural parallel connected windings is arranged far coupling an electromagnetic field to plasma in the chamber, one of the windings being an exterior winding located so an electromagnetic field generated by it is in proximity to a peripheral wall of the chamber, the remainder of the coil being arranged so electromagnetic fields generated by the remainder of the coil are remote from the chamber peripheral wall, the controller being arranged to cause the values of the total power the source supplies to the coil and of the reactances to be such that the electromagnetic field generated by the exterior winding is about the same as the electromagnetic field generated by the remainder of the coil.

14. A vacuum plasma processor for processing a workpiece, comprising a plasma excitation coil, the coil including plural connected parallel windings, a source for supplying power to the plural parallel windings, impedance arrangements respectively coupled with the plural parallel connected windings, the source frequency and the lengths of the windings being such that there are no substantial standing wave current variations along the length of each winding, the impedance arrangement coupled with each winding being arranged for controlling the value of the standing wave current in the respective winding.

15. A vacuum plasma processor for processing a workpiece, comprising a plasma excitation coil, the coil including at least one winding, the source frequency and the length of the at least one winding being such that there are no substantial standing wave current variations along the length of the at least one winding.

16. The plasma processor of claim 15 wherein the coil includes plural parallel windings, each having a length such that there are no substantial standing wave current variations along the lengths of the windings and further including impedance arrangements respectively coupled with the parallel windings and the impedance arrangement coupled with each winding being arranged for controlling the value of the current in the respective winding.

17. The plasma processor of claim 15 further including an impedance arrangement coupled with the at least one winding for controlling the value of the current in the at least one winding.

18. Apparatus for controlling distribution of electromagnetic fields for exciting a plasma in a vacuum plasma processor for processing a workpiece, the apparatus comprising an excitation coil for launching the fields, the coil including plural parallel connected windings for coupling electromagnetic fields to plasma in the chamber, an AC source for supplying power to the windings for causing different parallel currents to flow in the parallel connected windings, the plural parallel connected windings being arranged so (a) one of the windings is an exterior winding located so electromagnetic fields generated by it are in proximity to a peripheral wall of the chamber, and (b) electromagnetic fields generated by the remainder of the coil are remote from the chamber peripheral wall, and a controller arranged for varying the currents applied by the source to the windings for causing the electromagnetic field generated by the exterior winding to exceed the electromagnetic field generated by the remainder of the coil.

19. The apparatus of claim 18 wherein the windings of the coil include plural windings extending radially and circumferentially between a pair of excitation terminals connected for receiving power from output terminals of the source.

20. The apparatus of claim 19 wherein one of the windings is the interior winding and another of the windings is an exterior winding surrounding the interior winding.

21. Apparatus for controlling distribution of electromagnetic fields for exciting a plasma in a vacuum plasma processor for processing a workpiece, the apparatus comprising an excitation coil for launching the fields, the coil including plural windings for coupling electromagnetic fields to plasma in the chamber, an AC source for supplying power to the windings for causing different parallel currents to flow in the parallel connected windings, the plural parallel connected windings being arranged so (a) one of the plural parallel connected windings is an exterior winding located so electromagnetic fields generated by it are in proximity to a peripheral wall of the chamber, and (b) the electromagnetic fields generated by the remainder of the coil are remote from the chamber peripheral wall, and a controller arranged for varying the currents applied by the source to the windings for causing the electromagnetic field generated by the exterior winding to be less than the electromagnetic field generated by the remainder of the coil.

22. The apparatus of claim 21 wherein the windings of coil include plural windings extending radially and circumferentially between a pair of excitation terminals connected for receiving power from output terminals of the source.

23. The apparatus of claim 22 wherein one of the windings is the interior winding and another of the windings is an exterior winding surrounding the interior winding.

24. Apparatus for controlling distribution of electromagnetic fields for exciting a plasma in a vacuum plasma processor for processing a workpiece, the apparatus comprising an excitation coil for launching the fields, the coil including plural windings for coupling electromagnetic fields to plasma in the chamber, an AC source for supplying power to the windings for causing different parallel currents to flow in the parallel connected windings, and a controller nged for varying the currents applied by the source to the windings for causing the current flowing in one of the windings to remain substantially constant and the current in the remainder of the coil to change.

25. The apparatus of claim 24 wherein the coil includes plural windings extending radially and circumferentially between a pair of excitation terminals connected for receiving power from output terminals of the source.

26. The apparatus of claim 25 wherein one of the windings is an interior winding and another of the windings is an exterior winding surrounding the interior winding.

\* \* \* \* \*